(12) United States Patent
Fendel et al.

(10) Patent No.: US 10,407,793 B2
(45) Date of Patent: Sep. 10, 2019

(54) SUBSTRATE HOLDER FOR VERTICAL GALVANIC METAL DEPOSITION

(71) Applicant: Atotech Deutschland GmbH, Berlin (DE)

(72) Inventors: Arnulf Fendel, Berlin (DE); Ralph Rauenbusch, Berlin (DE); Tobias Bussenius, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 25 days.

(21) Appl. No.: 15/533,712

(22) PCT Filed: Dec. 16, 2015

(86) PCT No.: PCT/EP2015/079932
§ 371 (c)(1),
(2) Date: Jun. 7, 2017

(87) PCT Pub. No.: WO2016/096946
PCT Pub. Date: Jun. 23, 2016

(65) Prior Publication Data
US 2017/0321344 A1    Nov. 9, 2017

(30) Foreign Application Priority Data
Dec. 19, 2014   (EP) ..................................... 14199449

(51) Int. Cl.
*C25D 17/06* (2006.01)
*C25D 17/00* (2006.01)
(Continued)

(52) U.S. Cl.
CPC ........... *C25D 17/06* (2013.01); *C25D 17/001* (2013.01); *C25D 17/004* (2013.01);
(Continued)

(58) Field of Classification Search
CPC .. C25D 17/06; C25D 17/007; C25D 177/005; C25D 17/004; C25D 17/001; C25D 17/00; H01L 21/67126; H01L 21/68721
See application file for complete search history.

(56) References Cited

U.S. PATENT DOCUMENTS 8,236,151 B1    8/2012  Olson et al.
2002/0040849 A1  4/2002  Yamamoto
(Continued)

FOREIGN PATENT DOCUMENTS

WO    2012007526    1/2012

OTHER PUBLICATIONS

PCT/EP2015/079932; PCT International Search Report and Written Opinion of the International Searching Authority dated Mar. 16, 2016.
(Continued)

*Primary Examiner* — Alexander W Keeling
(74) *Attorney, Agent, or Firm* — Renner, Otto, Boisselle & Sklar, LLP

(57) ABSTRACT

A substrate holder for vertical galvanic metal deposition on a substrate, comprising a first substrate holder part and a second substrate holder part, wherein both said parts comprise an inner metal comprising part and an outer non-metallic part in which the substrate holder further comprises a hanging element in each substrate holder part, a first sealing element in each substrate holder part, a second sealing element between the inner metal comprising part and the outer non-metallic part of the substrate holder, a fastening system for detachably fastening both substrate holder parts to each other, a first contact element in each substrate holder part for forwarding current from an outer source through the hanging element to the at least second contact element, and a second contact element in each substrate
(Continued)

holder part for forwarding current from the at least first contact element to the substrate to be treated.

13 Claims, 7 Drawing Sheets

(51) Int. Cl.
    *H01L 21/687*     (2006.01)
    *H01L 21/67*     (2006.01)
    *H01L 21/288*     (2006.01)

(52) U.S. Cl.
    CPC ...... *C25D 17/005* (2013.01); *H01L 21/67126* (2013.01); *H01L 21/68721* (2013.01); *H01L 21/68757* (2013.01); *H01L 21/68764* (2013.01); *H01L 21/2885* (2013.01)

(56) References Cited

U.S. PATENT DOCUMENTS

| | | | |
|---|---|---|---|
| 2003/0010641 A1* | 1/2003 | Kholodenko | C25D 7/12 205/80 |
| 2004/0037682 A1* | 2/2004 | Yoshioka | C25D 17/06 414/458 |
| 2013/0134035 A1* | 5/2013 | Harris | C25D 17/008 204/242 |
| 2015/0225868 A1 | 8/2015 | Rauenbusch et al. | |

OTHER PUBLICATIONS

PCT/EP2015/079932; PCT International Preliminary Report on Patentability dated Apr. 19, 2017.

\* cited by examiner

SUBSTRATE HOLDER FOR VERTICAL GALVANIC METAL DEPOSITION

The present application is a U.S. National Stage Application based on and claiming benefit and priority under 35 U.S.C. § 371 of International Application No. PCT/EP2015/079932, filed 16 Dec. 2015, which in turn claims benefit of and priority to European Application No. 14199449.1 filed 19 Dec. 2014, the entirety of both of which is hereby incorporated herein by reference.

FIELD OF THE INVENTION

The present invention relates to a substrate holder for vertical galvanic metal, preferably copper, deposition on a substrate to be treated comprising a first substrate holder part and a second substrate holder part, wherein both substrate holder parts comprise an inner metal comprising part and an outer non-metallic part.

The present invention is further directed to the use of such an inventive substrate holder for galvanic metal, in particular copper, deposition on substrates to be treated, in particular semiconductor wafers.

BACKGROUND OF THE INVENTION

The invention relates to a substrate holder for galvanically treating, in particular galvanically coating, a planar substrate, for example wafers in order to produce semiconductor wafers, printed circuit boards or foils or other planar substrates to be treated.

In order to treat the substrate in a galvanic manner, said substrate is placed in an electrolyte bath that is located in a treatment container. Anodes are arranged in the treatment container for the galvanic coating. Metal is deposited on the product in a galvanic manner by virtue of applying a voltage between the anodes and the product. Substrate holders are used for the substrates to be treated in order to render possible an as large as possible range of use of the substrate, said substrate holders hold the substrate in a border area. It is desirable that the substrate can be partially or entirely automatically fastened to and released from the substrate holder.

Different applications can require that both sides of the substrate are treated galvanically. Although the two sides can be coated sequentially using different coating processes, it is desirable to coat both sides of the substrate simultaneously for example in order to carry out the method efficiently. Furthermore, it can be necessary to treat only one side of two substrates simultaneously.

OBJECTIVE OF THE PRESENT INVENTION

There is still a need for substrate holders for galvanically treating a substrate, which substrate holders provide advantages with respect to the above mentioned aims. There is in particular a need for substrate holders for treating a substrate, which substrate holder is arranged for the purpose of coating both sides of the substrate simultaneously.

It was especially an object of the present invention to provide a substrate holder having a unique inventive combination of sealing element elements, current contact elements and fastening elements in order to ensure that the substrate holder is not passable for treatment liquids. At the same time, the demanded metal, in particular copper, deposition on the surface of the respective substrate to be treated should be ensured to be uniform.

SUMMARY OF THE INVENTION

These objects and also further objects which are not stated explicitly but are immediately derivable or discernible from the connections discussed herein by way of introduction are achieved by a substrate holder having all features of claim 1. Appropriate modifications to the inventive substrate holder are protected in the dependent claims. Further, the present invention comprises the use of such a substrate holder for galvanic metal, in particular copper, deposition on substrates to be treated.

The present invention accordingly provides a substrate holder for vertical galvanic metal, preferably copper, deposition on a substrate to be treated comprising a first substrate holder part and a second substrate holder part, wherein both substrate holder parts comprise an inner metal comprising part and an outer non-metallic part characterized in that the substrate holder further comprises i) At least one hanging element in each substrate holder part for mechanically connecting the substrate holder to a treatment container, ii) At least one first sealing element in each substrate holder part arranged between the substrate to be treated and the respective substrate holder part, iii) At least one second sealing element for the entire substrate holder arranged between the inner metal comprising part of the substrate holder and the outer non-metallic part of the substrate holder, iv) At least one fastening system for detachably fastening both substrate holder parts to each other for holding the substrate to be treated, v) At least one first contact element in each substrate holder part for forwarding current from an outer source through the hanging element to the at least second contact element, and vi) At least one second contact element in each substrate holder part for forwarding current from the at least first contact element to the substrate to be treated.

It is thus possible in an unforeseeable manner to provide a substrate holder, which can be used for one side and two side metal depositions in an outstanding quality.

Furthermore, the inventive substrate holder is a unique inventive combination of sealing element elements, current contact elements and fastening elements, which ensure that the substrate holder is not passable for treatment liquids. At the same time, the demanded metal, in particular copper, deposition on the surface of the respective substrate to be treated is uniform.

BRIEF DESCRIPTION OF THE FIGURES

Objects, features, and advantages of the present invention will also become apparent upon reading the following description in conjunction with the figures, in which.

DETAILED DESCRIPTION OF THE INVENTION

In one embodiment, the substrate holder further comprises at least one third sealing element for the entire substrate holder arranged between the inner metal comprising part of the substrate holder and the outer non-metallic part of the substrate holder, wherein said third sealing element is more exterior than the second sealing element.

Such an additional third sealing element ensures further that no treatment liquid can pass the outer sealing element in form of the second sealing element to reach the interior area of the substrate holder, wherein the metal parts are.

In one embodiment, the fastening system comprises at least two, preferably three, first recess elements in the first substrate holder part and at least two, preferably three, first fastening elements in the second substrate holder part, wherein said first fastening elements are in conjunction with the respective first recess elements.

This combination of fastening elements and recesses serves the purpose to prevent that both substrate holder parts can even be only slightly shifted against each other during the metal deposition process or during installing the substrate holder in the respective treatment container.

In one embodiment, the substrate holder further comprises at least two, preferably three, first positioning elements in one substrate holder part for accurate central positioning of the at least one substrate to be treated.

Figure 1:
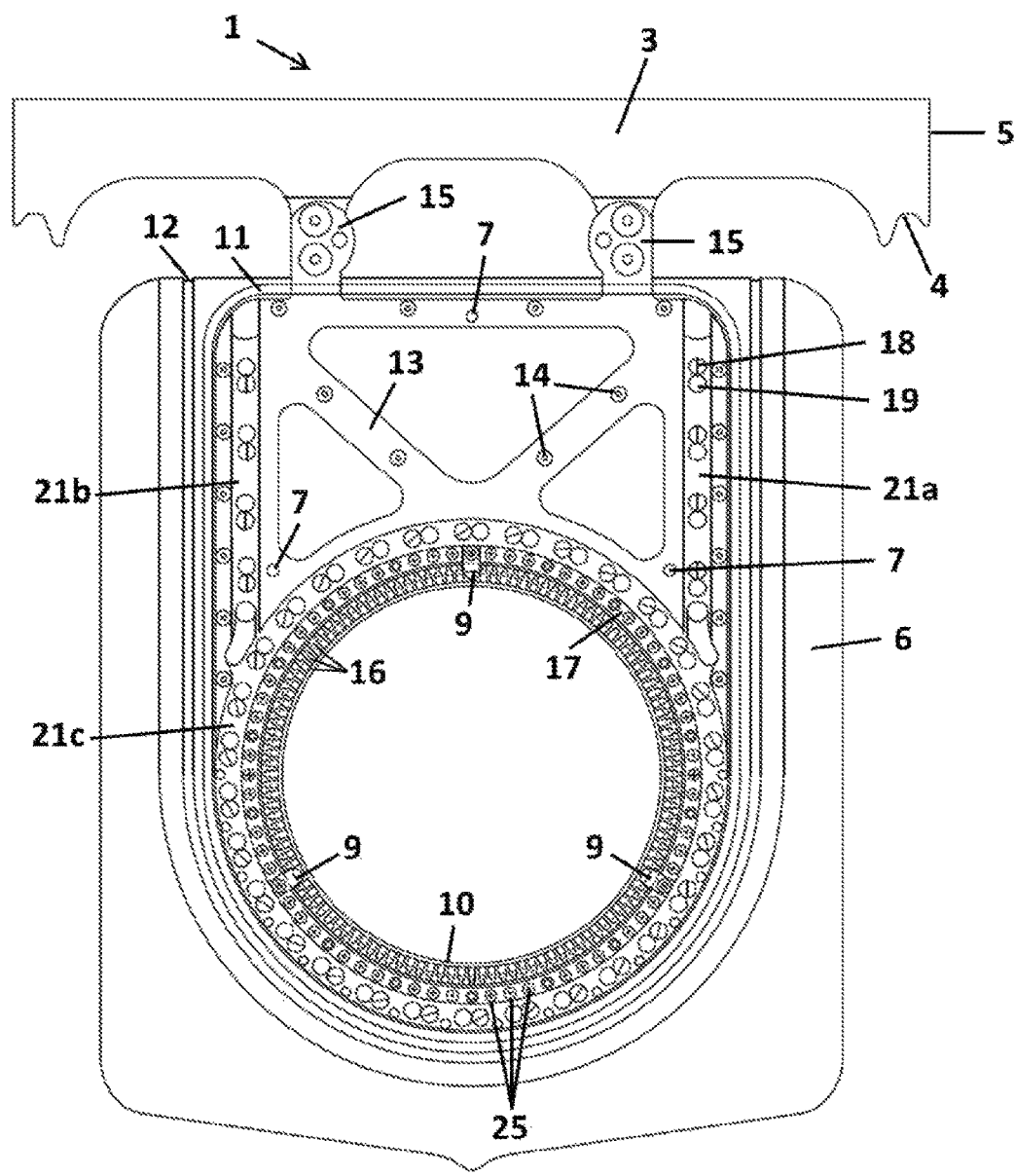
FIG. 1 exhibits a schematic front view of a first substrate holder part in accordance with an embodiment of the present invention.
Figure 2:
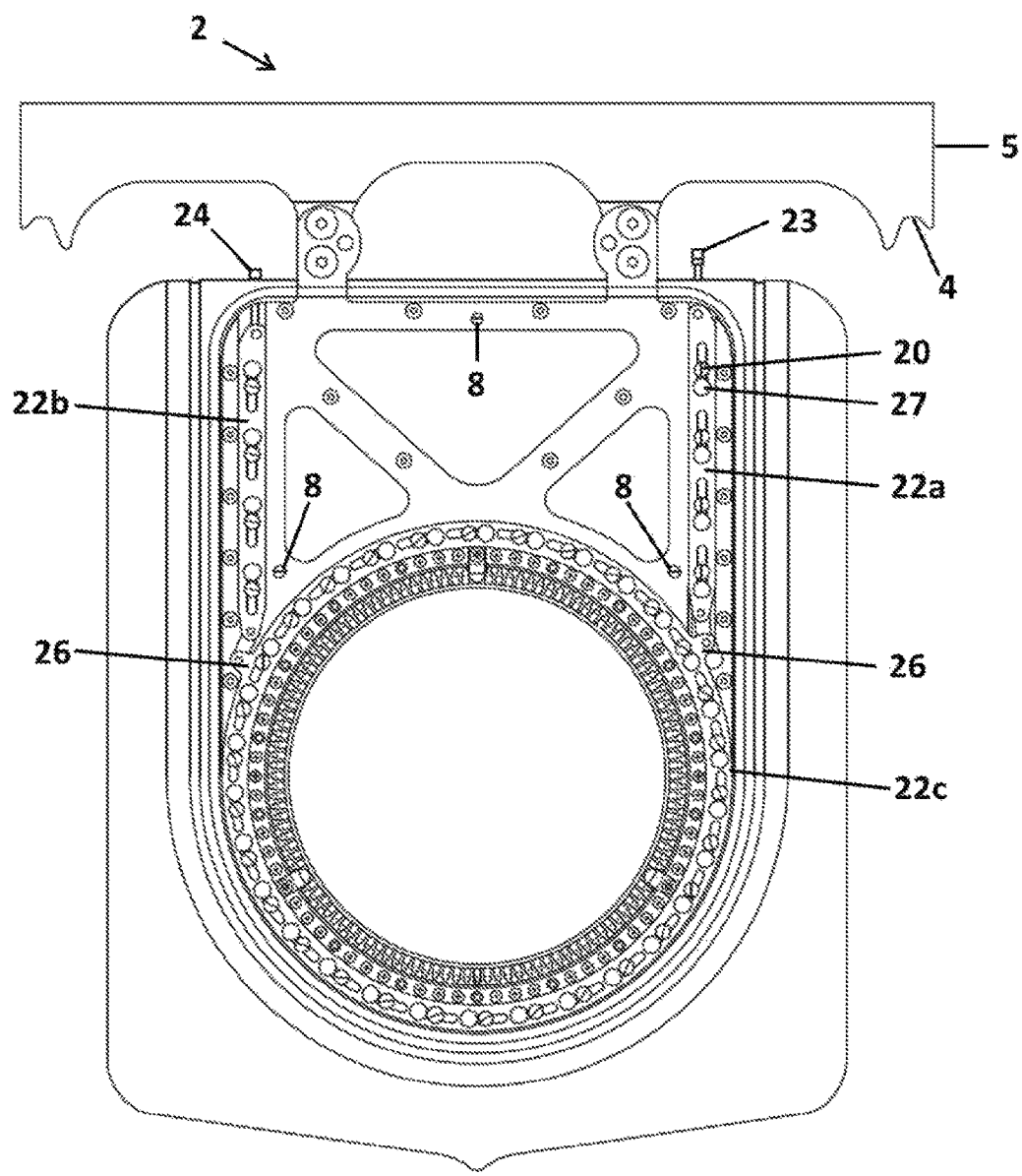
FIG. 2 exhibits a schematic front view of a second substrate holder part in accordance with an embodiment of the present invention.

Even if these first positioning elements have been shown in both FIGS. 1 and 2 representing both substrate holder parts, it has to be highlighted that only one substrate holder part can be provided with these positioning elements caused by their construction height. The presence in both FIGS. 1 and 2 is supposed to only serve illustration purposes because a user can choose in which substrate holder part he wants to include said positioning elements.

Such a high accurate positioning of the substrate to be treated is of high importance for achieving a uniform metal deposition by avoiding edge effects caused by an undesired shift of the substrate, even if the substrate is only slightly shifted.

In one embodiment, the substrate holder further comprises at least two second positioning elements at the exterior opposite ends of each hanging element for accurate mechanically positioning of the substrate holder in the treatment container.

This is supposed to serve the purpose that the substrate holder can be placed in the treatment container without generating undesired tension on the substrate holder by deviations of the vertical alignment of the substrate holder during introducing in the treatment container.

In one embodiment, the second contact element in each substrate holder part is formed in one part or in multiple parts, preferably in multiple parts. Herein, at least three parts are especially preferred.

In one embodiment, the second contact element in each substrate holder part comprises a plurality of contact finger elements.

In a preferred embodiment, the second contact element in each substrate holder part is formed in multiple parts, wherein each part of the second contact element comprises at least one, preferably at least 15, more preferably at least 25, contact finger elements.

In another preferred embodiment, the second contact element in each substrate holder part has a top conductive coating, preferably composed of a metal or of a metal alloy, wherein the at least one metal is selected from the group consisting of silver, gold, copper, platinum or palladium. Gold and platinum are especially preferred herein.

In one embodiment, the first contact element in one substrate holder part comprises at both exterior opposite ends directed to the outer current source a second recess element, while the first contact element in the other substrate holder part is a flat edge.

This is supposed to serve the purpose that the substrate holder can be contacted from an outer source of current without the risk that the contacting is non-uniform or nonconstant caused by undesired tension on the substrate holder, which can be generated by deviations of the vertical alignment of the substrate holder during introducing in the treatment container.

In one embodiment, the fastening system further comprises at least a plurality of second, third, fourth and fifth fastening elements, and a plurality of third recess elements in the first substrate holder part; while the fastening system further comprises at least a plurality of sixth, seventh, eighth, ninth, tenth, eleventh and twelfth fastening elements, and a plurality of fourth recess elements in the second substrate holder part; wherein the second fastening elements of the first substrate holder part are in conjunction with the fourth recess element of the second substrate holder part; and wherein the sixth fastening elements of the second substrate holder part are in conjunction with the third recess element of the first substrate holder part.

In a preferred embodiment, the second and sixth fastening elements are permanently fixed elements, which are unmovable in their position, such as screws, bolts, pins or alike; that the seventh, eighth, ninth and twelfth fastening element are metallic chains, wherein the ninth fastening element is a circular metallic chain running around the site of the substrate holder, which is adapted to receive the substrate to be treated, wherein the eighth and seventh fastening elements are two separated metallic chains running both linearly from said ninth fastening element to the upper side of the substrate holder, wherein the seventh and the eighth fastening element are each interconnected to the circular chain by the twelfth fastening element, wherein all these metallic chains in the second substrate holder part comprise a plurality of consecutive oblong holes, which comprise at the one end a circular fourth recess element; and that the first substrate holder part comprises the corresponding metallic fastening elements as counterpart to the respective fastening elements of the second substrate holder part.

In another preferred embodiment, the second and sixth fastening elements are permanently fixed elements, which are unmovable in their position, such as screws, bolts, pins or alike; that the seventh, eighth, ninth and twelfth fastening element are metallic chains, wherein the ninth fastening element is a rectangular, preferably a quadratic, metallic chain running around the site of the substrate holder, which is adapted to receive the substrate to be treated, wherein the eighth and seventh fastening elements are two separated metallic chains running both linearly from said ninth fastening element to the upper side of the substrate holder, wherein the seventh and the eighth fastening element are each interconnected to the rectangular, preferably a quadratic, metallic chain by the twelfth fastening element, wherein all these metallic chains in the second substrate holder part comprise a plurality of consecutive oblong holes, which comprise at the one end a circular fourth recess element; and that the first substrate holder part comprises the corresponding metallic fastening elements as counterpart to the respective fastening elements of the second substrate holder part.

This offers the advantage that the same fastening system can be used for both kind of substrates to be treated, circular ones and rectangular ones, wherein only the ninth fastening element has to be slightly constructive adapted. All conjunctions between the different fastening elements are and stay from their functional point of view identical.

The term "metallic chain" refers to a metallic element, which is comprised of flexible metallic subunits, or a metallic element, which is comprised of one single piece.

In one embodiment, the first sealing element comprises a double sealing element lip, wherein both lips are arranged in such a manner that both lips can contact the surface of the substrate to be treated if inserted.

In another embodiment, the first sealing element comprises a double sealing element lip, wherein both sealing element lips are arranged in such a manner that both sealing element lips are directed to the substrate to be treated in the center of the substrate holder.

In one embodiment, the second sealing element and/or the third sealing element comprise each a double sealing element lip, wherein both sealing element lips are arranged between both substrate holder parts in such a manner that both sealing element lips are directed to the outside of the substrate holder.

In one embodiment, the second sealing element and/or the third sealing element comprise each a modified double sealing element lip, wherein two sealing element lips are arranged between both substrate holder parts in direction to the outside of the substrate holder and wherein simultaneously two sealing element lips are directed to both substrate holder parts.

Such a special sealing element is amending the prevention of treatment liquid passage in the substrate holder on the one hand, but on the other hand it also increases the required pressure for closing the substrate holder by pressing both substrate holder parts together after introducing a substrate to be treated inside it. The more rigid the sealing element becomes, the safer is the prevention of liquid passage, but also the more force or pressure is required to fasten both parts of the substrate holder to each other.

It has been additionally found that such an inventive substrate holder of the present invention can be used for galvanic metal, in particular copper, deposition on substrates to be treated, in particular on semiconductor wafers.

The present invention thus addresses the problem of providing an amended substrate holder, which can be used for one side and two side metal depositions in an outstanding quality.

The following non-limiting examples are provided to illustrate an embodiment of the present invention and to facilitate understanding the invention, but are not intended to limit the scope of the invention, which is defined by the claims appended hereto.

Turning now to the Figures, FIG. 1 shows a schematic front view of a first substrate holder part 1 in accordance with an embodiment of the present invention. Said first substrate holder part 1 comprises one hanging element 3 for mechanically connecting the substrate holder to a treatment container and one first sealing element 10 arranged between the site of the first substrate holder part 1, where a substrate to be treated is adapted to be received, and the first substrate holder part 1.

Furthermore, the first substrate holder part 1 comprises two second positioning elements 4 at the exterior opposite ends of the hanging element 3 for accurate mechanically positioning of the substrate holder in the treatment container.

Furthermore, the first substrate holder part 1 comprises a second sealing element 11 arranged between the inner metal comprising part of the first substrate holder part 1 and the outer non-metallic part of the first substrate holder part 1.

Further, the first substrate holder part 1 comprises a third sealing element 12 arranged between the inner metal comprising part (non-metallic housing 6) of the first substrate holder part 1 and the outer non-metallic part of the first substrate holder part 1, wherein said third sealing element 12 is more exterior than the second sealing element 11.

There are also comprised three first recess elements 7 and three first positioning elements 9 for accurate central positioning of a substrate to be treated in the first substrate holder part 1.

There is also comprised one first contact element 13 for forwarding current from an outer source through the hanging element 3 to the second contact element 16. Herein, in this embodiment, the hanging element 3 is identical to the first contact element 13 because said first contact element 13 is completely made of metal. But, in principle there are also alternatives possible with a defined first contact element being only a specific metal line inside of the hanging element 3. There is also comprised a second contact element 16 for forwarding current from the first contact element 13 to the substrate to be treated.

Figure 7:
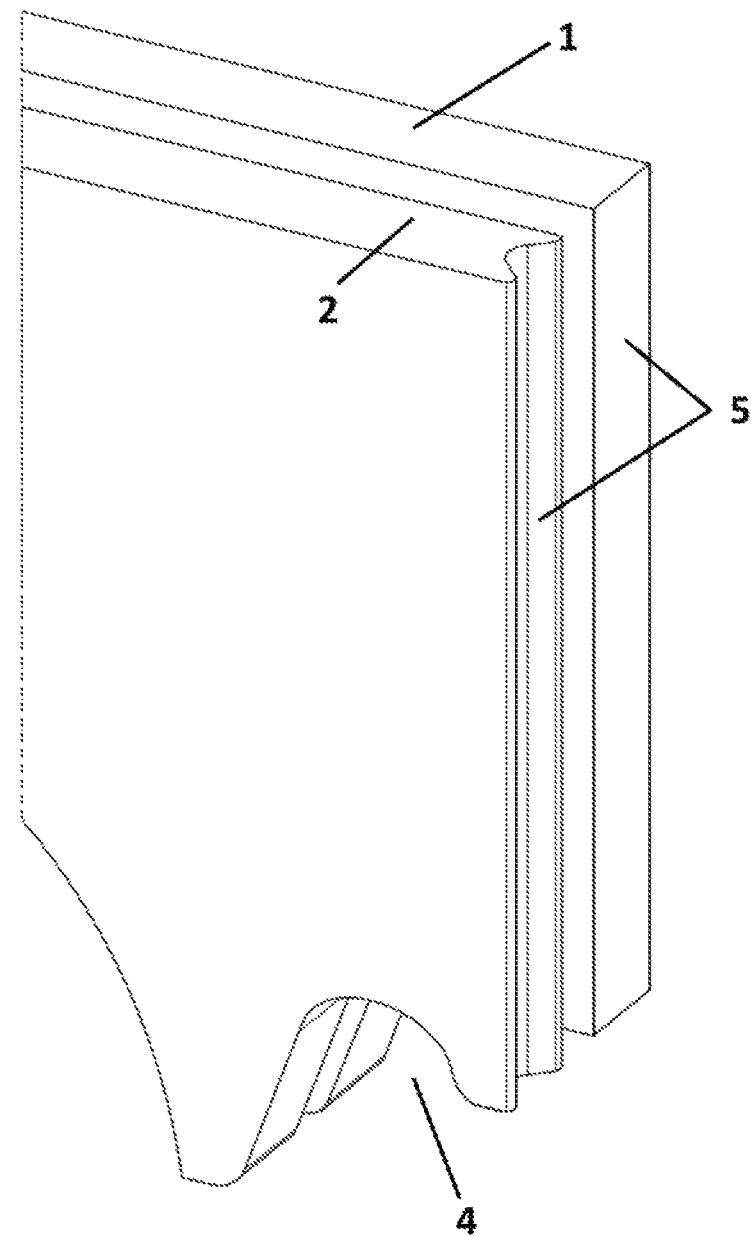
FIG. 7 exhibits a schematic perspective view on the hanging element of the first and the second substrate holder part in accordance with an embodiment of the present invention.

The first contact element 13 in one substrate holder part comprises at both exterior opposite ends directed to the outer current source a second recess element 5, while the first contact element 13 in the other substrate holder part provides a flat edge at both exterior opposite ends directed to the outer current source (better to see in FIG. 7).

The first contact element 13 is mounted on an outer non-metallic housing 6 by a plurality of a first mounting element 14, while said first contact element 13 is connected to the hanging element 3 by two second mounting elements 15.

The second contact element 16 is formed in three parts, wherein each part of the second contact element 16 comprises in this embodiment 39 contact finger elements.

Additionally, the first substrate holder part 1 comprises a fastening system for detachably fastening said first substrate holder part 1 to a corresponding second substrate holder part 2 for holding the substrate to be treated.

Herein, there is comprised a plurality of second 18, third 21a, fourth 21b and fifth 21c fastening elements, and a plurality of third recess elements 19 in the first substrate holder part 1. Herein, the second fastening elements 18 are permanently fixed elements, which are unmovable in their position, such as screws, bolts, and pins or alike. The first substrate holder part 1 comprises the fastening metallic fastening elements as counterpart to the respective fastening elements of the second substrate holder part 2.

There is further shown a third mounting element 17, which is an enhancement element for the second contact elements 16 for preventing that the contact fingers will bend or twist by applying pressure on them during providing physical contact between the metallic second contact element 16 and the substrate to be treated in the loading step. Said third mounting element 17 has the same partition as the second contact element, meaning if the second contact element comprises three parts, the third mounting element 17 is also comprised of three parts. A plurality of fourth mounting elements (screws) 25 have been used in the embodiment shown to mount the third mounting element 17 through the second contact element in the first contact element as will be better to see in FIG. 5.

All mounting elements except the third mounting element 17 in the sense of the present invention can be selected of common mounting elements known to a skilled artisan, such as screws, bolts, and pins or alike.

The features of the first substrate holder part 1, which are comprised in identical manner as well in the second substrate holder part 2 have not been again highlighted by the corresponding reference signs and will not be again discussed below for FIGS. 2 to 5, which are all based on the second substrate holder part 2 to avoid unnecessary repetition. These are the features having the following reference signs: 3-6, 10-17 and 25. Reference sign 9 has been chosen to be discussed for FIG. 1, even if the feature is also included in FIG. 2. It is only supposed to underline that this feature according to the appended set of claims can only be composed in one of the two substrate holder parts, not in both. In which one is negligible. Thus, it has been included in both FIGS. 1 and 2 for illustration purposes.

FIG. 2 shows a schematic front view of a second substrate holder part 2 in accordance with an embodiment of the present invention. As outlined above, there are only the features of the second substrate holder part 2 to be discussed, which are not included in FIG. 1.

FIG. 2 discloses a fastening system comprising a plurality of first 8, sixth 20, seventh 22a, eighth 22b, ninth 22c, tenth 23, eleventh 24 and twelfth 26 fastening elements, and a plurality of fourth recess elements 27 in the second substrate holder part 2; wherein the second fastening elements 18 of the first substrate holder part 1 are in conjunction with the fourth recess element 27 of the second substrate holder part 2; and wherein the sixth fastening elements 20 of the second substrate holder part 2 are in conjunction with the third recess element 19 of the first substrate holder part 1.

Herein, the sixth fastening elements 20 are permanently fixed elements, which are unmovable in their position, such as screws, bolts, and pins or alike. The seventh 22a, eighth 22b, ninth 22c and twelfth 26 fastening elements are metallic chains, wherein the ninth fastening element 22c is a circular metallic chain running around the site of the substrate holder, which is adapted to receive the substrate to be treated, wherein the eighth 22b and seventh 22a fastening elements are two separated metallic chains running both linearly from said ninth fastening element 22c to the upper side of the second substrate holder part 2, wherein the seventh 22a and the eighth 22b fastening element are each interconnected to the circular chain 22c by the twelfth fastening element 26, wherein all these metallic chains in the second substrate holder part 2 comprise a plurality of consecutive oblong holes, which comprise at the one end a circular fourth recess element 27. The first substrate holder part 1 comprises the respective corresponding metallic fastening elements as counterpart to the respective fastening elements of the second substrate holder part 2.

The fastening system comprises three first fastening elements 8 in the second substrate holder part 2, which are designated to become in conjunction with the respective three first recess elements 7 of the first substrate holder part 1.

Figure 3:
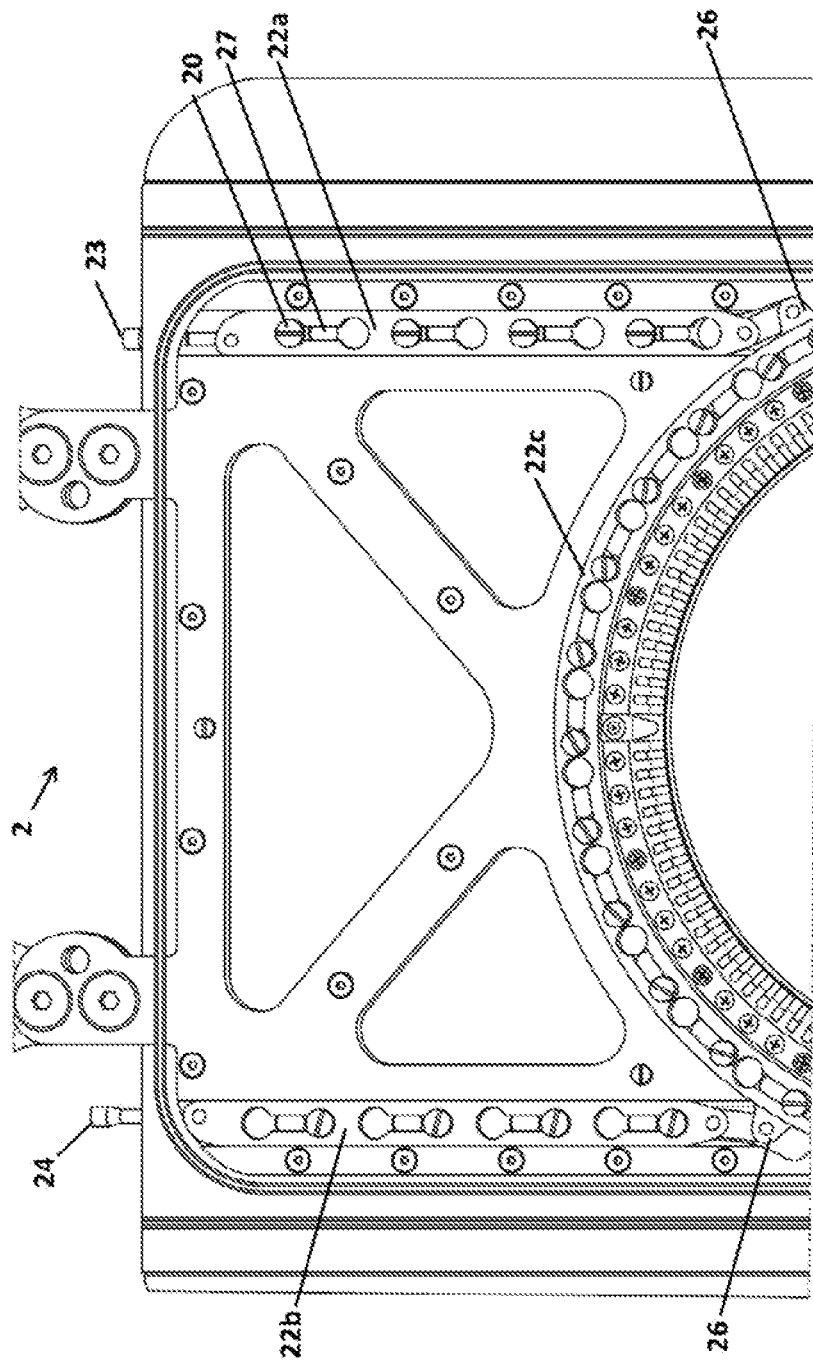
FIG. 3 exhibits a schematic enlarged front view of a part of the second substrate holder part having a closed fastening system in accordance with the same embodiment of the present invention as shown in FIG. 2.

FIG. 3 shows a schematic enlarged front view of a part of the second substrate holder part 2 having a closed fastening system in accordance with the same embodiment of the present invention as shown in FIG. 2.

Figure 4:
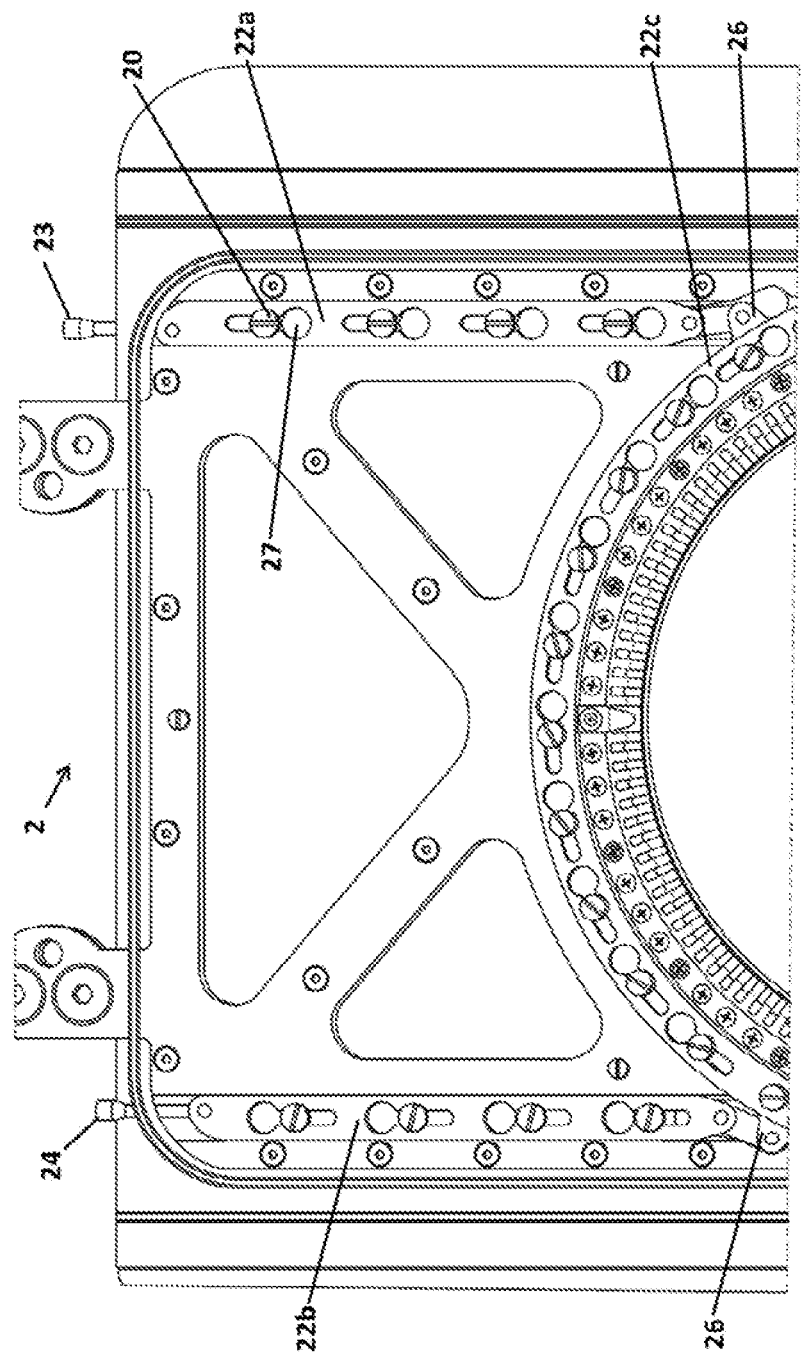
FIG. 4 exhibits another schematic enlarged front view of the same part of the second substrate holder part having an opened fastening system in accordance with the same embodiment of the present invention as shown in FIG. 2.

FIG. 4 shows another schematic enlarged front view of the same part of the second substrate holder part 2 having an opened fastening system in accordance with the same embodiment of the present invention as shown in FIG. 2.

These two Figures have been included to allow a more detailed view on the fastening mechanism of the substrate holder itself and especially of the substrate holder part 2. As can be easily derived by said FIGS. 3 and 4, the locking mechanism for such a substrate holder functions by a shift of the position of the sixth fastening element 20, which is itself not movable, in relation to the seventh fastening element 22a par example. The only parts of the fastening system of the substrate holder, which are moving or can be moved at all, are the seventh 22a, eighth 22b, ninth 22c and twelfth 26 fastening elements.

The tenth 23 and eleventh 24 fastening elements serve the purpose of manually open and close the substrate holder by pushing or pressing the respective fastening element, which is more outside of the non-metallic outer housing 6.

Figure 5:
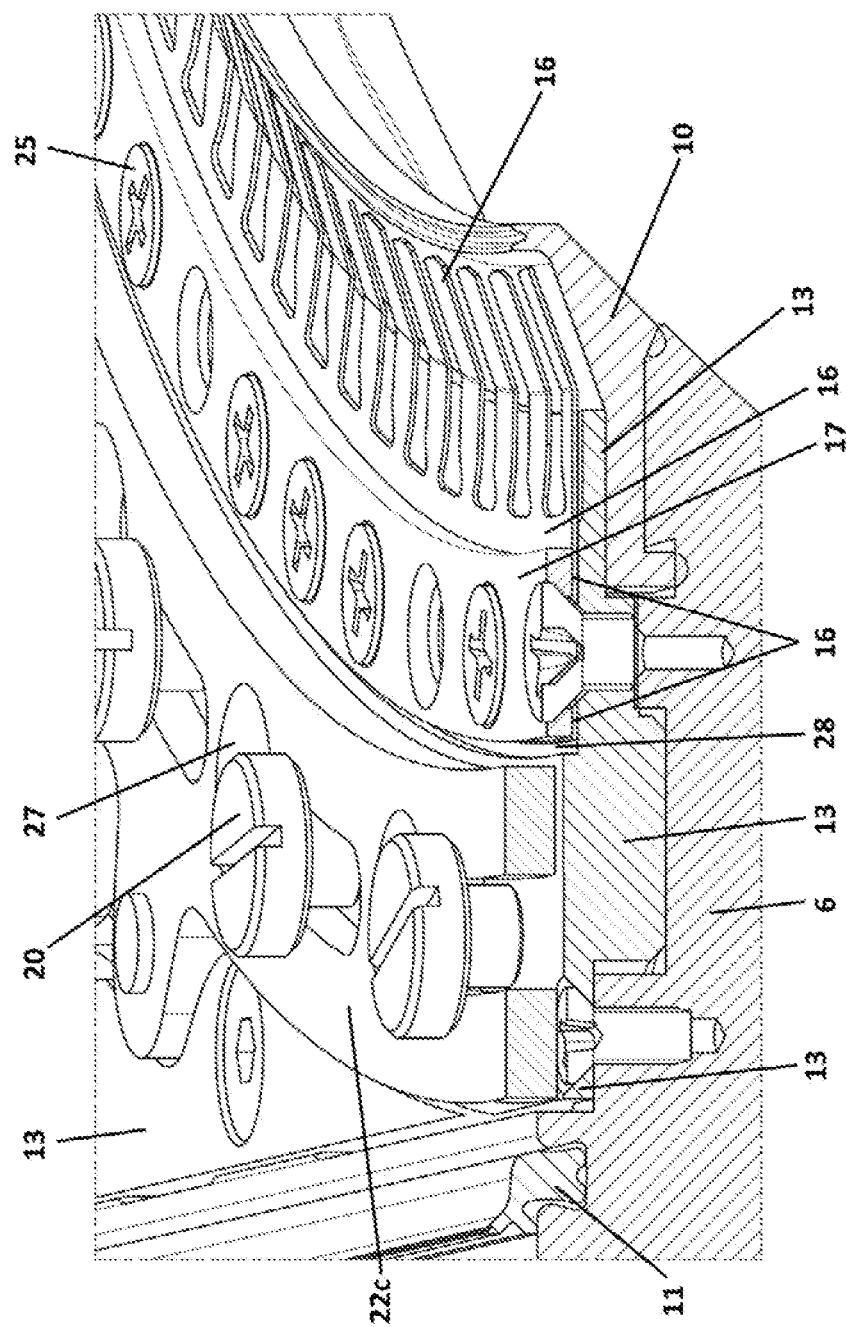
FIG. 5 exhibits another schematic enlarged perspective view of a part of the second substrate holder part in accordance with the same embodiment of the present invention as shown in FIG. 2.

FIG. 5 shows another schematic enlarged perspective view of a part of the second substrate holder part 2 in accordance with the same embodiment of the present invention as shown in FIG. 2.

Herein, it is remarkable that there is a small gap 28 between the third mounting element 17 and the second contact elements 16 in form of contact fingers on the one side and the first contact element 13, which possesses there a circular running edge. In a preferred embodiment of the present invention, the third mounting element 17 and the second contact elements 16 can also be arranged directly adjacent to this edge of the first contact element 13 thereby eliminating the gap 28.

This would offer the advantage that the accurate positioning of the substrates to be treated inside of this substrate holder becomes even more effective due to the fixed unchangeable alignment then between the aforementioned elements 13, 16 and 17. An undesired shift, bent, twist or deformation of the contact fingers as second contact element could be thereby avoided, even if relatively high pressure or forces are required for fastening both parts 1 and 2 of the substrate holder to each other during introducing a substrate to be treated.

Figure 6:
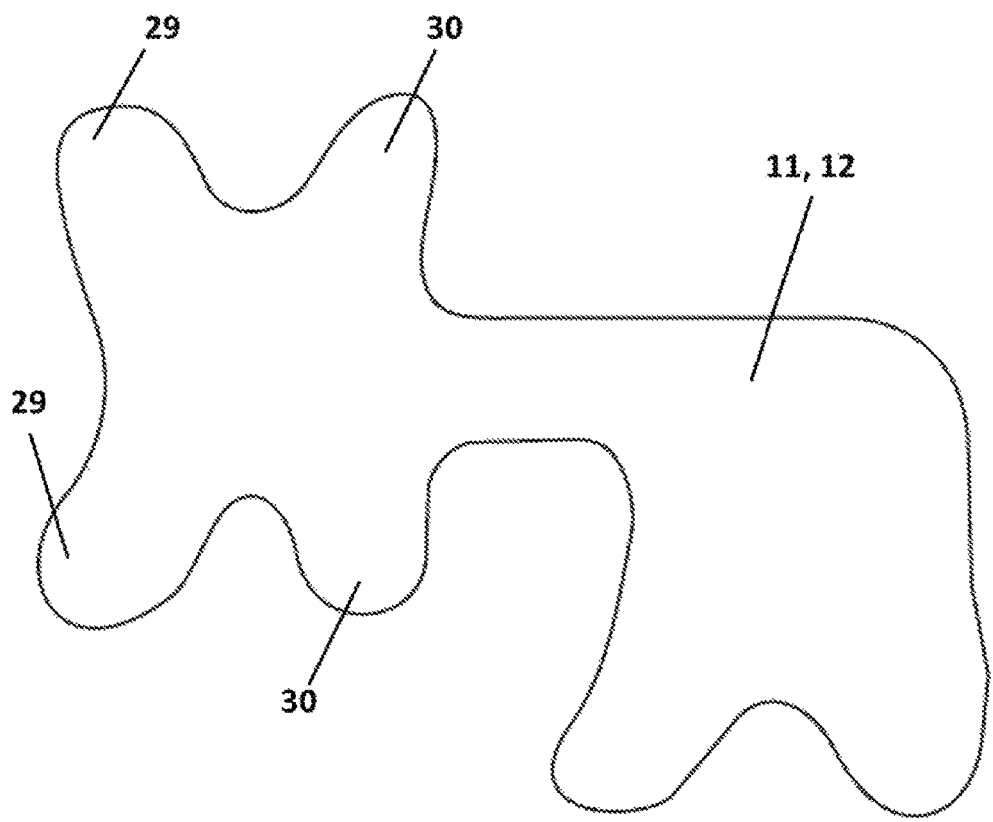
FIG. 6 exhibits a schematic side view of a specific possible second and/or third sealing element in accordance with an embodiment of the present invention.

FIG. 6 shows a schematic side view of a specific possible second 11 and/or third 12 sealing element in accordance with an embodiment of the present invention. Such an alternative second 11 or third 12 sealing element comprise a modified double sealing element lip, wherein two sealing element lips can be arranged between both substrate holder parts in direction to the outside of the substrate holder. Simultaneously two sealing element lips are directed to both substrate holder parts 1,2.

FIG. 7 shows a schematic perspective view on the hanging element 3 of the first 1 and the second 2 substrate holder part in accordance with an embodiment of the present invention.

Herein, the first contact element 13 in one substrate holder part 2 comprises at both exterior opposite ends directed to the outer current source a second recess element 5, while the first contact element 13 in the other substrate holder part 1 is a flat edge. Substrate holder parts 1 and 2 could also be exchanged. Therefore, the reference sign has been kept constant at 5, even if one area is flat and one comprises a recess.

Furthermore, there is again good to see that the substrate holder further comprises two second positioning elements 4 at the exterior opposite ends of each hanging element 3 for accurate mechanically positioning of the substrate holder in the treatment container.

It will be understood that the embodiments described herein are merely exemplary and that a person skilled in the art may make many variations and modifications without departing from the scope of the invention. All such variations and modifications, including those discussed above, are intended to be included within the scope of the invention as defined by the appended claims.

REFERENCE SKINS

1 First substrate holder part
2 Second substrate holder part
3 Hanging element
4 Second positioning element
5 Second recess element
6 Non-metallic housing
7 First recess element
8 First fastening element
9 First positioning element
10 First sealing element
11 Second sealing element
12 Third sealing element
13 First contact element
14 First mounting element
15 Second mounting element
16 Second contact element
17 Third mounting element
18 Second fastening element
19 Third recess element
20 Sixth fastening element
21a,b,c Third, fourth and fifth fastening element
22a,b,c Seventh, eighth and ninth fastening element
23 Tenth fastening element
24 Eleventh fastening element
25 Fourth mounting element
26 Twelfth fastening element
27 Fourth recess element
28 Gap
29 sealing element lip, which is directed to the outside of the substrate holder
30 sealing element lip, which is directed to a substrate holder part

The invention claimed is:
1. Substrate holder for vertical galvanic metal deposition on a substrate to be treated comprising
a first substrate holder part and a second substrate holder part, wherein both substrate holder parts comprise an inner metal comprising part and an outer non-metallic part characterized in that the substrate holder further comprises
i) At least one hanging element in each substrate holder part for mechanically connecting the substrate holder to a treatment container;
ii) At least one first sealing element in each substrate holder part arranged between the substrate to be treated and the respective substrate holder part;
iii) At least one second sealing element in each substrate holder part arranged between the inner metal comprising part of each substrate holder and the outer non-metallic part of each substrate holder;
iv) At least one fastening system for detachably fastening both substrate holder parts to each other for holding the substrate to be treated, wherein the fastening system comprises a first recess element in the first substrate holder part and a first fastening element in the second substrate holder part, wherein said first fastening element is in conjunction with the first recess element for fastening both substrate holder parts;
v) At least one first contact element in each substrate holder part for forwarding current from an outer source through the hanging element to at least one second contact element; and
vi) wherein the at least one second contact element in each substrate holder part is configured for forwarding current from the at least one first contact element to the substrate to be treated;
vii) wherein the fastening system further comprises
at least a plurality of second fastening elements, and third, fourth and fifth fastening elements, and a plurality of third recess elements in the first substrate holder part;
at least a plurality of sixth fastening elements, and seventh, eighth, ninth, tenth, eleventh and twelfth fastening elements, and a plurality of fourth recess elements in the second substrate holder part;
wherein the plurality of second fastening elements of the first substrate holder part are in conjunction with the plurality of fourth recess elements of the second substrate holder part;
wherein the plurality of sixth fastening elements of the second substrate holder part are in conjunction with the plurality of third recess elements of the first substrate holder part;
wherein the plurality of second and sixth fastening elements are permanently fixed elements, which are unmovable in their position;
wherein the third, fourth, and fifth fastening elements are part of a metallic chain;
wherein the fifth fastening element is a circular or rectangular metallic element running around the site of the first substrate holder part, which is adapted to receive the substrate to be treated;
wherein the third and the fourth fastening elements are two separated metallic elements running both linearly from said fifth fastening element to the upper side of the first substrate holder part;
wherein the third and the fourth fastening element are each interconnected to the fifth circular or rectangular metallic element;
wherein all the metallic elements in the first substrate holder part comprises a plurality of consecutive oblong holes, which comprise the plurality of third recess elements;
wherein the seventh, eighth, ninth and twelfth fastening element are part of a metallic chain;
wherein the ninth fastening element is a circular or rectangular metallic element running around the site of the second substrate holder part, which is adapted to receive the substrate to be treated;

wherein the eighth and seventh fastening elements are two separated metallic elements running both linearly from said ninth fastening element to the upper side of the second substrate holder part;

wherein the seventh and the eighth fastening element are each interconnected to the ninth circular or rectangular metallic element by the twelfth fastening element;

wherein all the metallic elements in the second substrate holder part comprises a plurality of consecutive oblong holes, which comprise the plurality of fourth recess elements; and wherein the tenth and the eleventh fastening elements open and close the substrate holder by pushing or pressing the respective fastening element.

2. Substrate holder according to claim 1 characterized in that the substrate holder further comprises at least one third sealing element in each substrate holder part arranged between the inner metal comprising part of each substrate holder and the outer non-metallic part of each substrate holder, wherein said third sealing element is more exterior than the second sealing element.

3. Substrate holder according to claim 1 characterized in that the substrate holder further comprises at least two first positioning elements in one substrate holder part for accurate central positioning of the at least one substrate to be treated.

4. Substrate holder according to claim 1 characterized in that the substrate holder further comprises at least two second positioning elements at the exterior opposite ends of each hanging element for accurate mechanically positioning of the substrate holder in the treatment container.

5. Substrate holder according to claim 1 characterized in that the at least one second contact element in each substrate holder part is formed in multiple parts.

6. Substrate holder according to claim 1 characterized in that the at least one second contact element in each substrate holder part comprises a plurality of contact finger elements.

7. Substrate holder according to claim 6 characterized in that the at least one second contact element in each substrate holder part is formed in multiple parts, wherein each part of the second contact element comprises at least one said contact finger elements.

8. Substrate holder according to claim 1 characterized in that the first contact element in one substrate holder part comprises at both exterior opposite ends directed to the outer current source a second recess element, while the first contact element in the other substrate holder part is a flat edge.

9. Substrate holder according to claim 1 characterized in that the first sealing element in each substrate holder part comprise a double lip sealing element, wherein both lips are arranged in such a manner that both lips can contact the surface of the substrate to be treated if inserted.

10. Substrate holder according to claim 2 characterized in that the second sealing element and/or the third sealing element in each substrate holder part comprise each a double lip sealing element, wherein both lips are arranged between both substrate holder parts in such a manner that both lips are directed toward the outside of the substrate holder.

11. Substrate holder according to claim 2 characterized in that the second sealing element and/or the third sealing element in each substrate holder part comprise each a modified double lip sealing element, wherein two lips are arranged between both substrate holder parts in a direction toward the outside of the substrate holder and wherein simultaneously two lips are directed toward both substrate holder parts.

12. Substrate holder according to claim 2 characterized in that the substrate holder further comprises at least two first positioning elements in one substrate holder part for accurate central positioning of the at least one substrate to be treated.

13. Substrate holder according to claim 6 characterized in that the at least one second contact element in each substrate holder part is formed in multiple parts, wherein each part of the second contact element comprises at least 15 said contact finger elements.

* * * * *